United States Patent [19]
Amador et al.

[11] Patent Number: 6,069,342
[45] Date of Patent: May 30, 2000

[54] AUTOMATED MULTIPLE LEAD FRAME STRIP RADIANT DIE ATTACH MATERIAL CURING APPARATUS

[75] Inventors: Gonzalo Amador; Katherine Gail Heinen, both of Dallas; Jessie Buendia, Richardson; Leslie E. Stark, Dallas, all of Tex.; Chill Go, Baguio, Philippines

[73] Assignee: Texas Instruments Incorporated, Dallas, Tex.

[21] Appl. No.: 08/999,062

[22] Filed: Dec. 16, 1997

Related U.S. Application Data

[60] Provisional application No. 60/033,360, Dec. 18, 1996.

[51] Int. Cl.⁷ .............................. B65G 25/08; B65G 1/06; H01L 21/52; F27B 9/38
[52] U.S. Cl. ...................... 219/388; 156/275.5; 414/187; 414/214; 414/331.13; 198/346.1
[58] Field of Search ...................... 219/388; 156/272.2, 156/275.5; 29/559; 414/160, 172, 187, 214, 331.13, 331.16, 417; 198/346.1

[56] References Cited

U.S. PATENT DOCUMENTS

| | | | |
|---|---|---|---|
| 4,712,963 | 12/1987 | Kondo | 414/331.13 |
| 4,979,464 | 12/1990 | Kunze-Concewitz et al. | 414/331.14 |
| 5,516,251 | 5/1996 | Ichikawa | 414/331.13 |
| 5,727,917 | 3/1998 | Fuke et al. | 414/331.13 |
| 5,827,035 | 10/1998 | Fuke et al. | 414/417 |
| 5,993,591 | 11/1999 | Buendia et al. | 156/275.5 |

FOREIGN PATENT DOCUMENTS

| | | |
|---|---|---|
| 5-259205 | 10/1993 | Japan . |
| 10-310245 | 11/1998 | Japan . |
| 10-321655 | 12/1998 | Japan . |

*Primary Examiner*—Joseph Pelham
*Attorney, Agent, or Firm*—W. James Brady, III; Frederick J. Telecky, Jr.

[57] ABSTRACT

A method of curing a die attach material for a semiconductor device which includes providing a carrier containing a plurality of stacked leadframe strips, each leadframe strip with a die attach material thereon. One leadframe strip is ejected from the carrier, travels into a chamber and is centered therein. The leadframe strip is then heated and the die attach material is cured selective to the leadframe strip using a tungsten-halogen lamp. Simultaneously volatile products of the cure are exhausted from the chamber. The leadframe strip is then returned to its original position in the carrier, the carrier is elevated so that a different leadframe strip is in position for ejection from the carrier and is ejected.

10 Claims, 12 Drawing Sheets

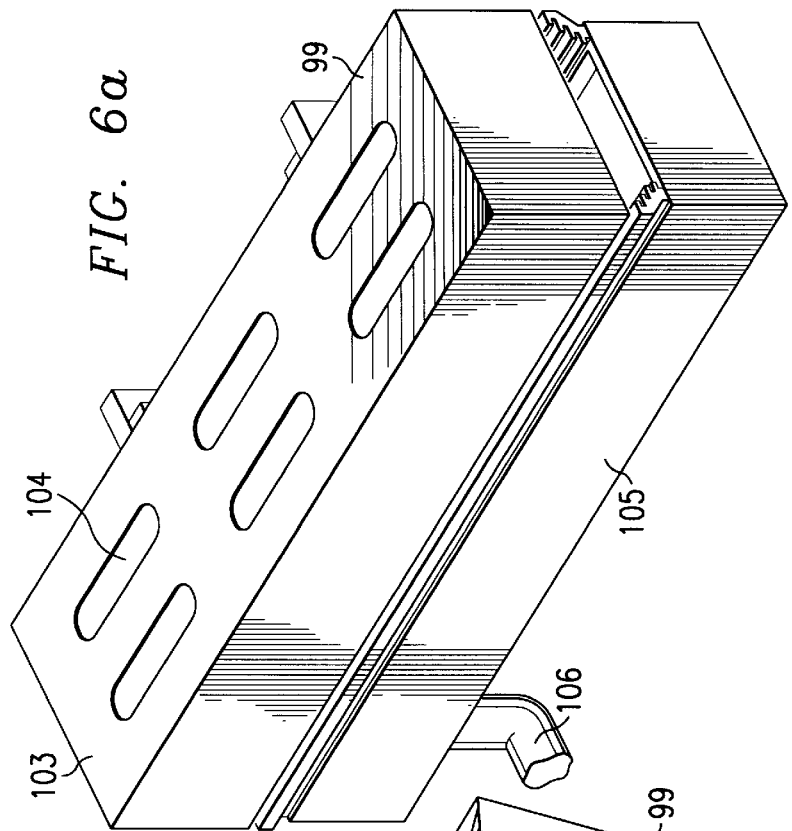
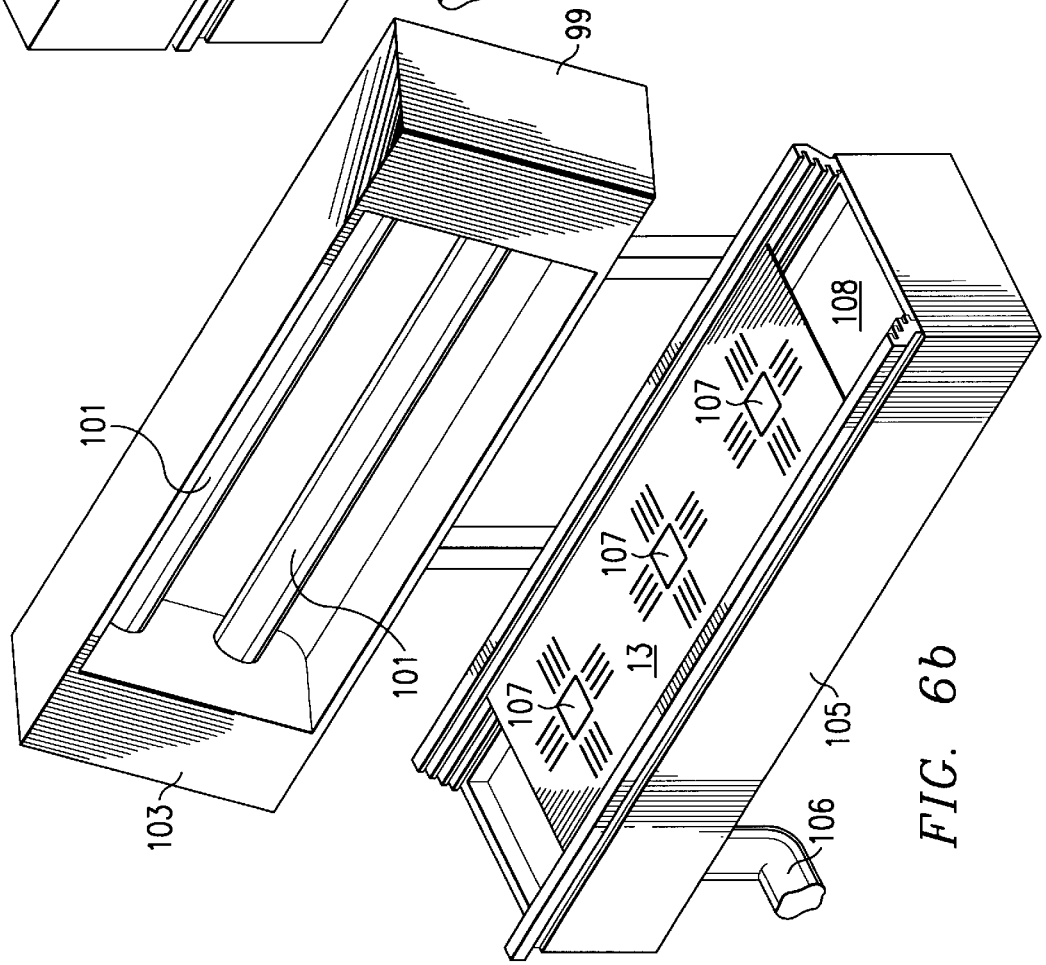

AUTOMATED MULTIPLE LEAD FRAME STRIP RADIANT DIE ATTACH MATERIAL CURING APPARATUS

This application claims priority under 35 USC §119(e)(1) of provisional application number 60/033,360 filed Dec. 18, 1996.

BACKGROUND OF THE INVENTION

1. Field of the Invention

This invention relates to a die attach meaterial curing apparatus and method and, more specifically, to a radiant energy die attach material curing apparatus and method.

2. Brief Description of the Prior Art

In the fabrication of semiconductor devices, the cure process for die attach materials is generally achieved via a batch process in a large nitrogen purged convection oven. Die attach involves curing of the die attach material, generally an epoxy, which secures the semiconductor die to the leadframe. Other solutions to the stand alone "snap cure" of die attach material use heater block contact and/or forced convection technology to transfer energy to the target.

In the batch process, the leadframes and semiconductor die (or dies if plural leadframes are used) are secured together with a die on each leadframe by placing the die over the uncured die attach paste material and then placing the leadframe strips in carriers. These carriers are fed into a chamber, which is a forced air and convection oven, for a predetermined period of time, usually several hours, the temperature in the chamber being determined by the type of die attach used and other well known factors. The heat in the chamber heats up the die and the die attach material and causes crosslinking of the die attach polymer adhesive material with the die thereby being secured to the die attach material and to the leadframe.

The prior art die attach material cure processes as described above require a relatively long curing time and also are relatively dirty due to the outgassing caused as a result of the curing process. The materials resulting from the outgassing remain at least in part in the chamber and can deposit on the semiconductor die, thereby causing a possible degrading of the electrical properties of the final semiconductor device. It is therefore apparent that better die attach material curing techniques are highly desirable.

SUMMARY OF THE INVENTION

In accordance with the present invention, the above described impediments of the prior art are materially reduced and there is provided a die attach material curing apparatus and method whereby the curing time is substantially diminished relative to the prior art. This is accomplished wherein the gases resulting from the curing of the die attach material are substantially eliminated from the curing chamber during the curing procedure, thereby minimizing contamination of the semiconductor die with these gases.

Briefly, the above is accomplished by providing a system which includes an elevator assembly for receiving carriers, each carrier having stacked leadframe strips therein spaced from each other, such as with shelves in the carrier, with a die held to each leadframe by uncured die attach paste material. The elevator moves in a vertical direction to position a selected one of the leadframe strips therein relative to a gooser assembly whereby the gooser assembly is aligned with a particular leadframe strip in each carrier to move that leadframe strip out of the carrier in a direction normal to the direction of elevator movement. The leadframe strip, which has now been moved out of the carrier, is received by a pinch roller which moves the leadframe strip into a curing chamber. A front flag, a mechanism in the curing chamber, locates the leadframe strip in the center of the curing chamber. After curing of the die attach material in the chamber for a predetermined time, a rear flag of the mechanism in the curing chamber moves the leadframe strip back against the pinch roller which, together with the front flag, move the leadframe strip back into its original position in the carrier. The elevator then lines up another of the leadframe strips in the carrier with the gooser assembly and the procedure is repeated until the die attach material on all of the leadframe strips in the carrier has been cured. The carriers with leadframe strips and die attached thereto with cured die attach material are then removed.

The elevator assembly is capable of receiving carriers of different widths which can accommodate leadframe strips having different widths, yet will center the carriers in the elevator assembly, regardless of carrier width. This is accomplished by providing a pair of rotatable polygonal solids on one side of the carrier, the polygonal solids having an axis disposed such that the distance from the axis to each side of the polygon is different. Air cylinders are provided on the other side of the carrier to push the carrier against the eccentric blocks. In this way, by adjusting the position of each of the polygonal solids about its axis such that a selected like pair of the sides faces the carrier, the dimension between these surfaces and the rotational axis of the rotatable polygonal solids is selected to accommodate the carrier being used.

The leadframe strip handling system is designed to accommodate leadframe strips of different widths. It does so by providing multi-level tracks. Each leadframe strip width has its own distinct leadframe strip track. The tracks are nested within each other. The largest width track is at the top and the smallest width track is at the bottom with the intermediate width being located therebetween. In this way, the larger width leadframe strips are closer to the radiation source than are the smaller width leadframe strips. Different process parameters can compensate for the increased distance for the smaller width lead frames strips.

The designs of the multiple level tracks and the pinch roller allow for quick adjustment among different leadframe strip widths. For each leadframe strip track, there is a freely rotating idler bearing. The idler bearings are sized so that the difference in radii is equivalent to the spacing between the multi-level tracks. All bearings share a common shaft so aligning any of the bearings to its corresponding track automatically aligns the remaining (two being shown in the preferred embodiment) bearings to their corresponding track. A single drive wheel is used to engage any one of the free rotating bearings at a given time. The shaft of the drive wheel is designed with detent positions which correspond to the horizontal distance between each pair of the free rotating bearings. In this way, the drive wheel can be quickly aligned to the free bearing of choice by simple pulling or pushing the shaft so that the correct detent feature is engaged in the spring loaded ball plunger of the drive pulley.

As stated above, the drive wheel shaft can be adjusted axially within the drive pulley. The shaft is located when the spring loaded ball plunger of the drive pulley engages one of the detent positions machined into the drive shaft. In this way, the drive wheel can be quickly aligned horizontally to any of the, for example, in the preferred embodiment, three free rotating bearings.

The drive pulley is mounted on an arm which is in turn mounted to a linear bearing. The linear bearing has enough travel so that the drive wheel can engage the smallest of the (three in the preferred embodiment) rotating bearings as well as be driven to a position higher than the largest of the bearings to allow unobstructed passage of a leadframe strip.

The drive pulley is driven by a flexible belt. The tension of the belt is used to generate a force between the drive belt and the driven bearing sufficient to translate the captured leadframe strip along the leadframe strip track. The belt is stretched over the pulleys and must be sufficiently flexible to allow travel of the drive pulley to a position higher than the largest of the free rotating bearings.

The rapid cure process (RCP) modules or curing chambers include, in addition to a lamp of the type described in Ser. No. 08/255,197, filed Jun. 7, 1994, the contents of which are incorporated herein by reference, a blower which blows air over the leadframe strip and an exhaust system which removes gases out of the module to remove all volatiles released during the die attach operation. Such a module is set forth in Ser. No. 08/991,128, now U.S. Pat. No. 5,993,591 filed concurrently herewith (TI-21972), the contents of which are incorporated herein by reference. Each module further includes a mechanism to complete positioning of the leadframe strip within the module for curing and removal after curing. This includes a first finger (flag) mechanism at the entrance to the module to move the leadframe strip farther into the module and properly center the leadframe strip within the module. When the curing is completed, the first finger rotates out of the path of the leadframe strip and the second finger (flag) moves the leadframe strip against the pinch rollers which then move the leadframe strip back into the carrier. The final push into the carrier is accomplished with the first finger mechanism which has travelled out of the chamber and rotated back into position. The elevator then moves the carrier vertically so that the gooser assembly is positioned opposite a different one of the leadframe strips in the carrier and the procedure is repeated until all of the leadframe strips in the carrier have entered the chamber and the die attach thereon has been cured.

It should be understood that the elevator can carry several carriers in side by side relation which are elevated and lowered together. Each of the carriers will then have an associated gooser, pinch roller and module of the type described whereby plural leadframe strips can be cured concurrently. The plural leadframe strips can operated upon simultaneously (i.e., all being cured together) or the leadframe strips in each carrier can be separately controlled.

BRIEF DESCRIPTION OF THE DRAWINGS

FIGS. 6a and 6b show the curing chamber as used in accordance with the present invention in both the open and closed states.

DESCRIPTION OF THE PREFERRED EMBODIMENT

Figure 1A:
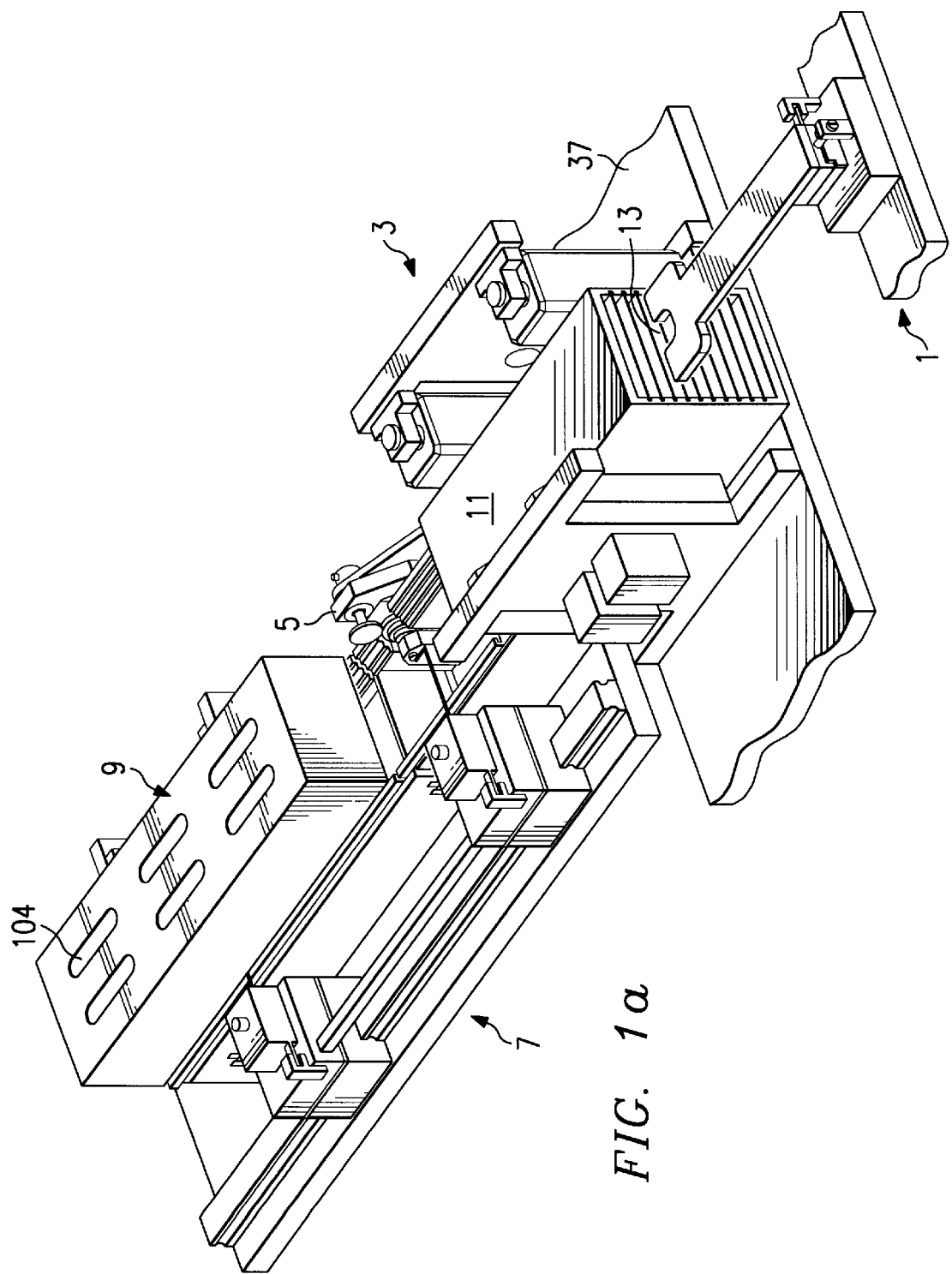
FIGS. 1a to 1g demonstrate a process flow in conjunction with a schematic diagram of an automated multiple lead frame strip radiant die attach material curing apparatus in accordance with the present invention.

Referring to FIG. 1a, there is shown a system for die attach material curing in accordance with the present invention at the inception of the die attach material curing procedure. The system includes a gooser assembly 1 for ejecting a leadframe strip 13 disposed in a leadframe strip carrier 11 toward a leadframe strip track and pinch roller assembly 5 which moves the leadframe strip into a curing chamber 9. An elevator base plate 37 with eccentric clamp assembly 3 positions the carrier 11 in line with the desired path of travel as will be explained and also provides proper vertical positioning of the carrier so that only a preselected leadframe strip 13 is ejected from the carrier. An in-chamber transport assembly 7 properly positions the leadframe strip within the curing chamber 9. The operation of the individual components will be described hereinbelow.

Figure 2:
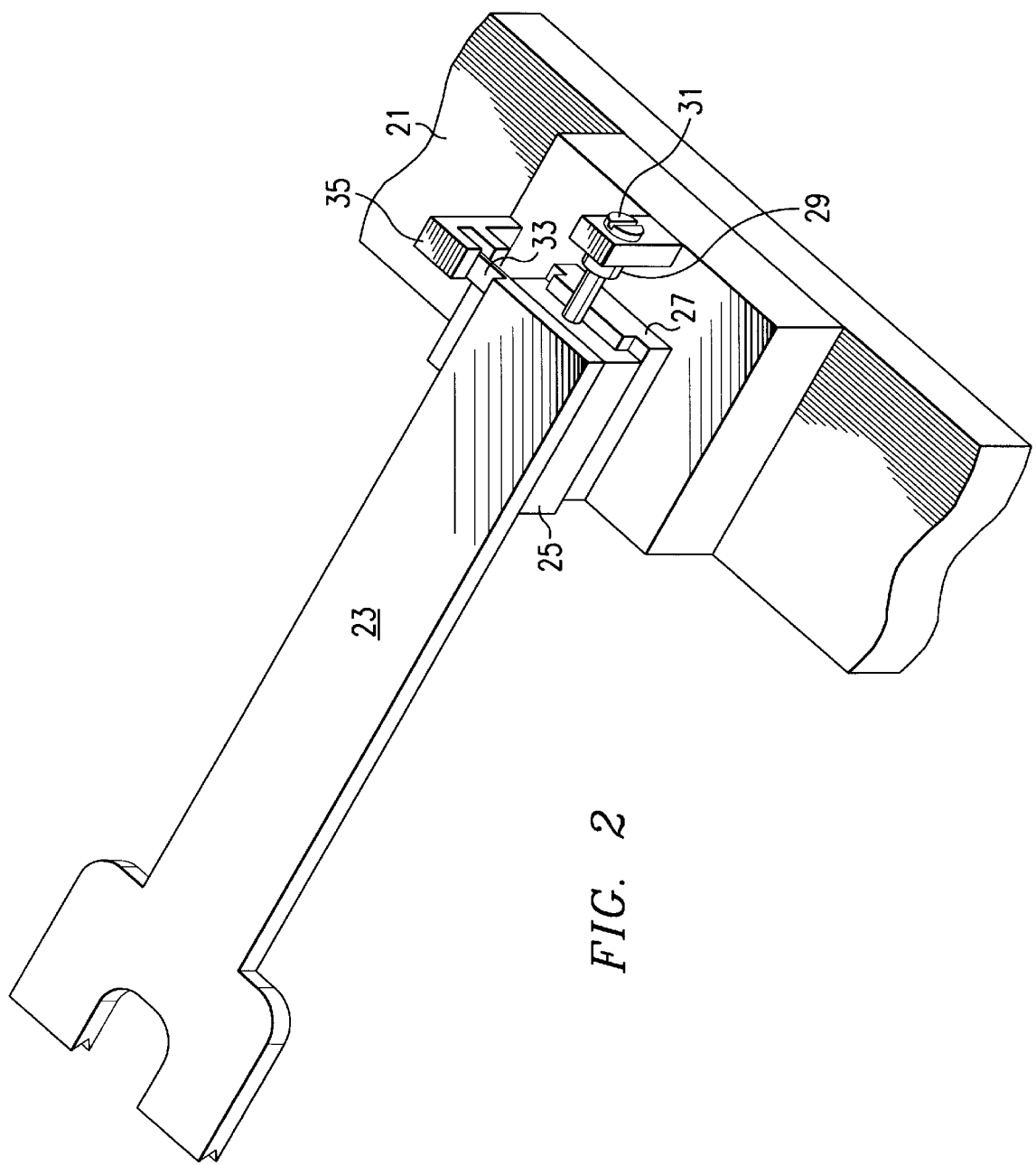
FIG. 2 is a preferred embodiment of a gooser assembly in accordance with the present invention.

Referring now to FIG. 2, there is shown a preferred embodiment of a gooser assembly 1 in accordance with the present invention. The gooser assembly includes a gang gooser base plate 21 onto which is mounted the remainder of the gooser assembly. The base plate 21 is movable toward and away from the carrier 11 on command. The remainder of the assembly includes a gooser blade 23 which is secured to a linear bearing 25 which moves in a reciprocating motion along a path defined by a member 27 secured to the base plate 21. The gooser blade 23 engages a leadframe strip 13 in the carrier 11 to eject the leadframe strip from the carrier onto the leadframe strip track 5. The linear bearing is spring loaded toward the lead frame by means of a compression spring 29 which is adjustable by means of an adjustment screw 31 in standard manner. A jam flag 33 is attached to the gooser blade 23 and is used in conjunction with the jam sensor 35 to detect when the motion of the gooser blade is obstructed. The jam sensor 35 is a photo sensor which is normally blocked by the jam flag 33. If the motion of the gooser blade 23 is obstructed, the spring pre-load is overcome and the linear bearing 25 translates in the direction opposite to the motion of the gooser base plate 21. This motion compresses the spring 29 and causes the jam flag 33 to move out of the jam sensor, allowing the photo sensor 35 to change state, thus indicating a jam of the gooser blade.

Figure 3A:
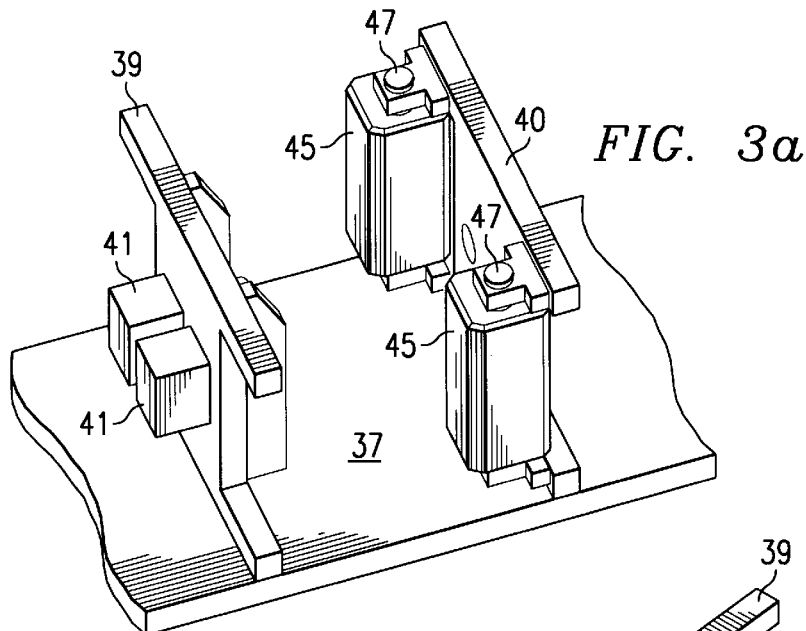
FIGS. 3a, 3b and 3c show the elevator base plate with one carrier clamp assembly of the present invention in greater detail.
Figure 3B:
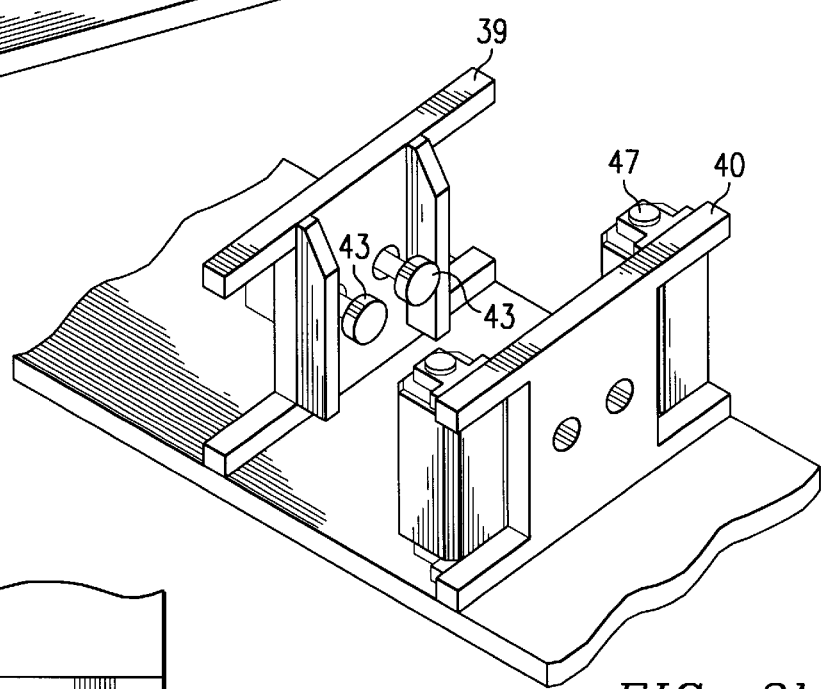
Figure 3C:
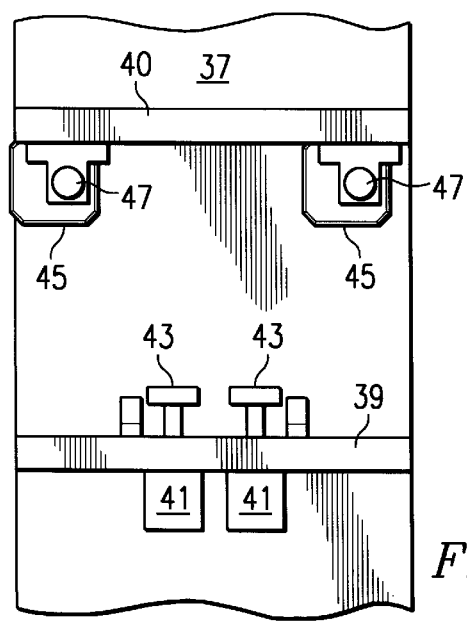

Referring now to FIGS. 3a, 3b and 3c, there is shown the elevator base plate with one carrier clamp assembly 3 in greater detail. As shown, the elevator base plate 37 has a pair of spaced apart parallel walls 39, 40 secured thereto. Mounted on the wall 39 is a pair of air cylinders 41 having air cylinder plungers 43 extending into the space between the walls. Mounted on the wall 40 is a pair of eccentric blocks 45, each having a pivot axis 47. As can best be seen in FIG. 3c, the eccentric blocks are mounted off center so that the distance from the wall 39 to the innermost portion of a block differs for each block face when that block face faces the wall 39. These distances are preset to accommodate the standard carrier widths. It is also apparent that the blocks 45 can be replaced in the event none of the four faces accommodates the carrier width then being used. It should also be noted that the blocks 45 can have more or fewer than the four working surfaces as shown. The air plungers 43 maintain a force against the carrier 11 to insure proper alignment of the carrier with the path for leadframe strip travel. The elevator base plate 37 is typically mounted on an elevator which will adjust the position thereof so that a predetermined leadframe strip 13 in the carrier 11 will be ejected by the gooser blade 23.

Figure 4A:
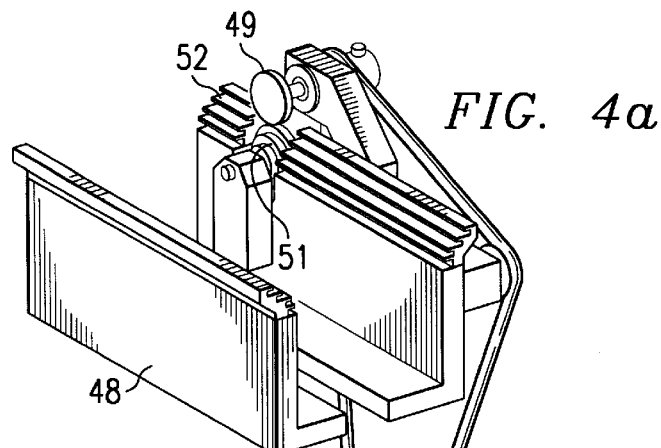
FIGS. 4a, 4b and 4c show a preferred embodiment of the pinch roller assembly in accordance with the present invention.
Figure 4B:
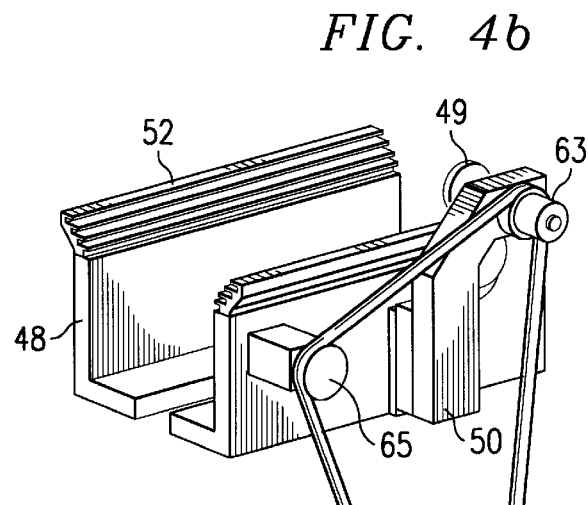
Figure 4C:
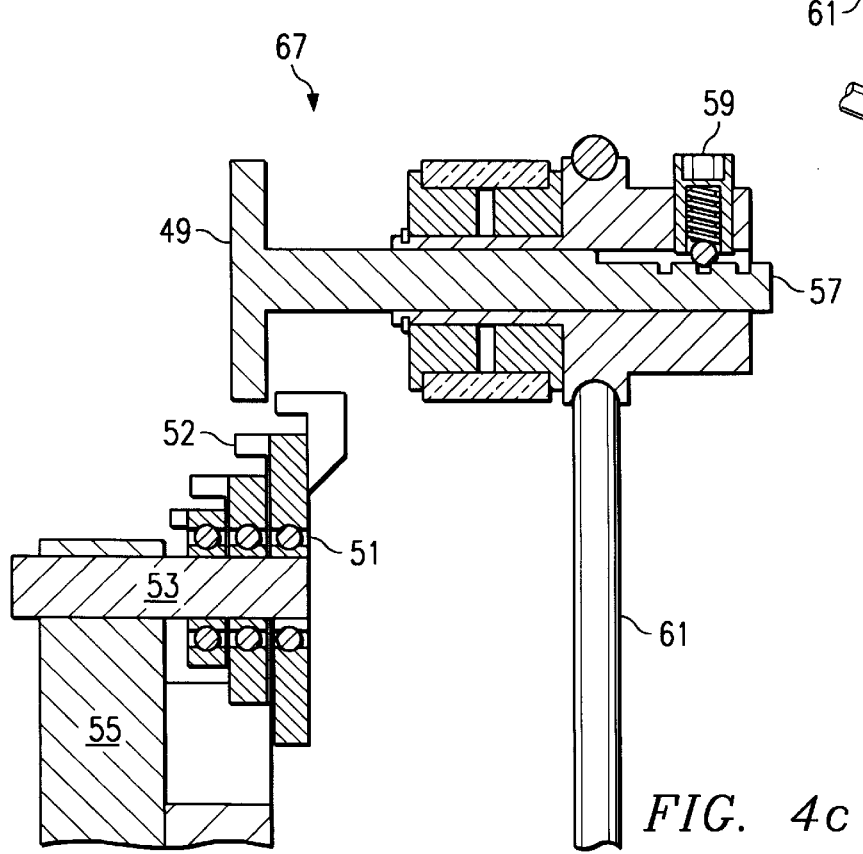

Referring now to FIGS. 4a, 4b and 4c, there is shown a preferred embodiment of the leadframe strip track and pinch roller assembly 5. The leadframe strip track and pinch roller assembly include a multi-level leadframe strip track 52 as part of the base 48. A drive disc support arm 50 is mounted on a linear bearing 56 which is in turn mounted to the base 48 and supports a drive disc 49 which is laterally positionable to mate with one of the coaxial, multiple, freely rotating bearings 51, one such bearing positioned for each level of the multi-level leadframe strip track and extending to the surface of its associated track. As can best be seen in FIG. 4c, the bearings 51 are mounted on a freely rotating bearing shaft 53 and mount 55 and the position of the drive disc 49 is adjusted by a stepped drive disc shaft 57, the shaft being locked by a spring loaded ball plunger 59. The drive disc 49 is driven by a drive belt 61 which rotates a driven pulley 63 secured to the shaft 57 and operating in conjunction with an idler pulley 65 and a drive pulley and shaft 67.

Figure 5:
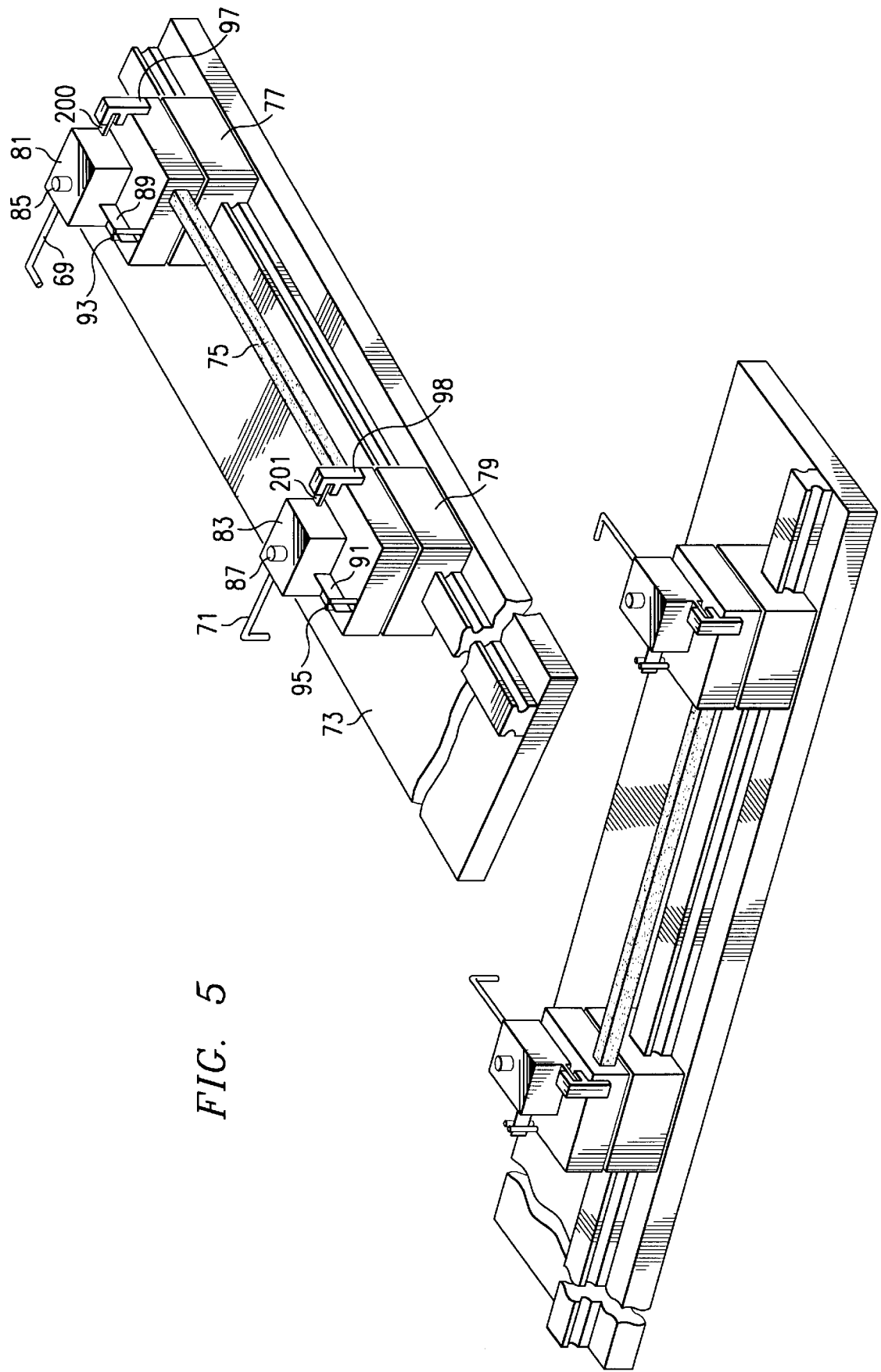
FIG. 5 is a preferred embodiment of the in-chamber transport assembly in accordance with the present invention.

Referring to FIG. 5, there is shown a preferred embodiment of the in-chamber transport assembly 7. This assembly includes a base plate 73 on which the remainder of the assembly structure is disposed and a first front flag 69 and a second rear flag 71 which extend into the curing chamber 9. The front flag 69 is rotatable into or out of the path of the leadframe strip and is used to gently push the leadframe strip along the leadframe strip tracks both into the chamber 9 and later into the carrier 11. The rear flag 71, which does not rotate, remains in the path of the leadframe strip 13 and us used to gently push the leadframe strip along the leadframe strip tracks out of the chamber 9. A carriage connecting rod 75 links the front carriage 77 to the rear carriage 79, both of which travel on a common linear bearing way and are driven together as a unit. Rotation of the front flag 69 allows a leadframe strip to be trapped between flags 69 and 71 for fine positioning within the chamber. A pivoting flag mount 81,83 is disposed on each carriage 77, 79 for carrying its associated flag 69,71. The flag mounts 81,83, which are affixed to their respective pivoting flag mount 81,83 are free to pivot on a pivot axis 85,87, but are held in a "home" position by the action of a flat spring 89,91 secured within a pair of stationary pins 93, 95. If an obstruction is encountered by the rear or front flag 71,69, the flag mount of the flag encountering the obstruction will pivot and the flat spring will flex and translate between the two fixed pins. Once the obstruction is cleared, the flat springs return to their normal, unbent state and the pivoting flag mounts are again square to the axis of travel. A jam flag 200,201 is attached to the pivoting flag mounts 81,83 and is used in conjunction with a jam sensor 97,98 to detect when the motion of the rear or front flag is obstructed. The jam sensor photo sensor 97,98 is normally blocked by the jam flag 200,201, If the front 69 or rear 71 flag motion is obstructed, the flat spring 89,91 is flexed and the flag mount 81,83 pivots away from the obstruction. This motion causes the jam flag 200,201 to move out of the jam sensor 97,98, thereby allowing the photo sensor to change state, thus indicating a "jam" of the flag.

Referring now to FIGS. 6a and 6b, there is shown the curing chamber 9 in both the open and closed state. The chamber includes a top portion 99 which includes tungsten halogen lamps 101 which provide the energy for the cure and a reflector assembly behind the lamps and air slits 104, which allow outside air into chamber 9 and a bottom portion 105 which includes an extension of the multilevel track described in conjunction with FIGS. 4a to 4c to accommodate different width leadframe strips and diffuser plate 108 and exhaust outlet 106. It can be seen in FIG. 6a that the reflector assembly is spaced from the bottom portion 105 to permit operation of in-chamber transport. Air flows through the system by creating a low pressure condition at the exhaust outlet 106. Air enters the reflector through the air slits 104, flows around the lamps 101, through the leadframe strips 13, through the diffuser plate(s) 108 and out of the exhaust outlet 106. This flow of air through the system removes contamination resulting from the cure process. The diffuser plates 108 serve to create a uniform flow of air along and across the leadframe strip target. A leadframe strip 13 is disposed in the chamber with chips 107 thereon to perform the die attach process.

In operation, and referring again to FIG. 1a, initially the pinch roller drive disc is positioned axially so that the middle cut-out of the shaft is engaged by the spring plunger. This aligns the drive disc to the middle freely rotating bearing of the multiple pinch roller idler bearing assembly. This arrangement indicates that the leadframe strip will travel in the center track of the multi-level leadframe strip track. The gooser platform height is adjusted so that the gooser blade is aligned to the middle leadframe strip track. Carrier clamp eccentric blocks 45 are rotated to the appropriate position so that the leadframe strip magazine is centered about the middle leadframe strip track, widthwise. The system is now set for operation.

Figure 1B:
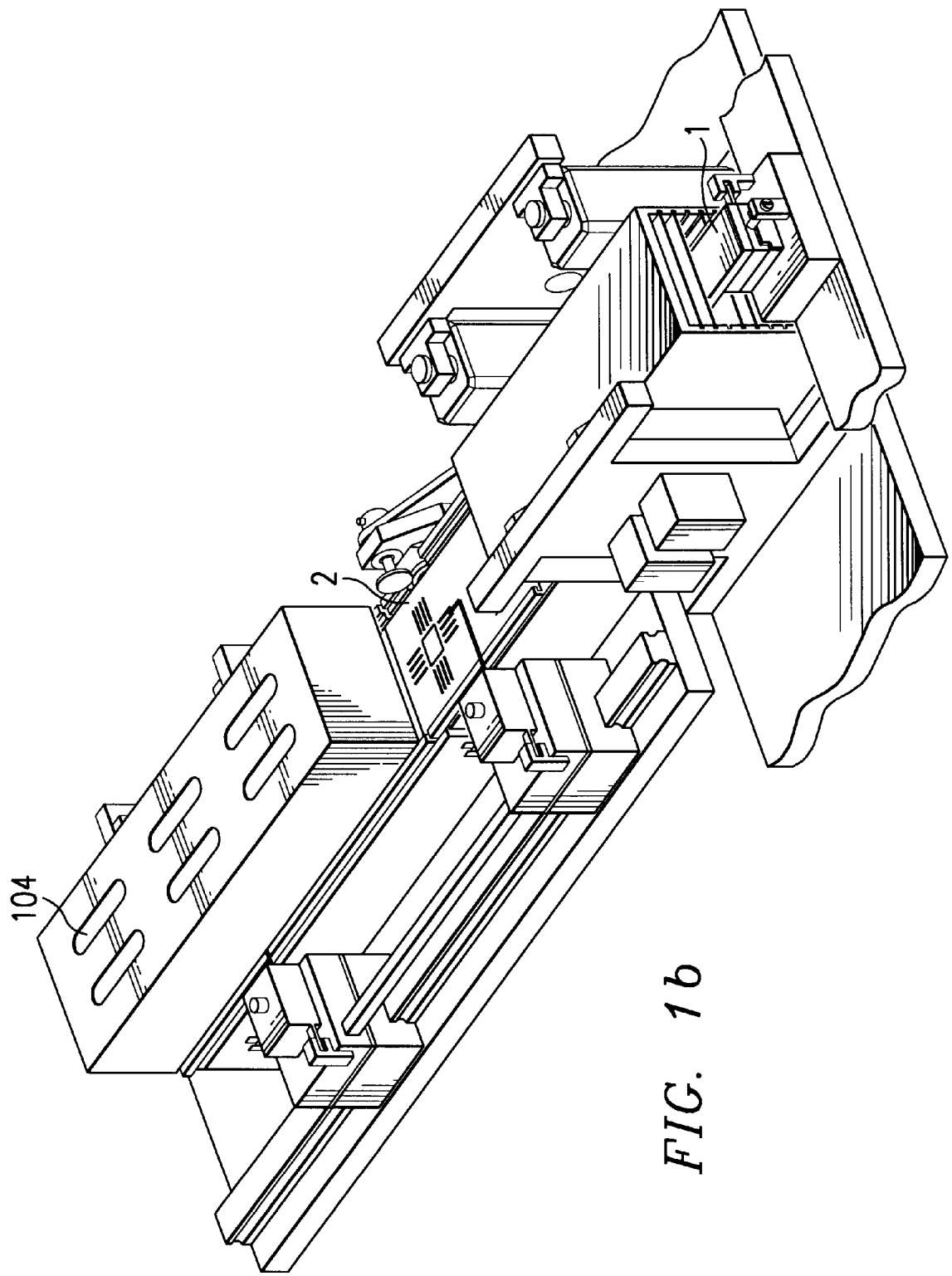
Figure 1C:
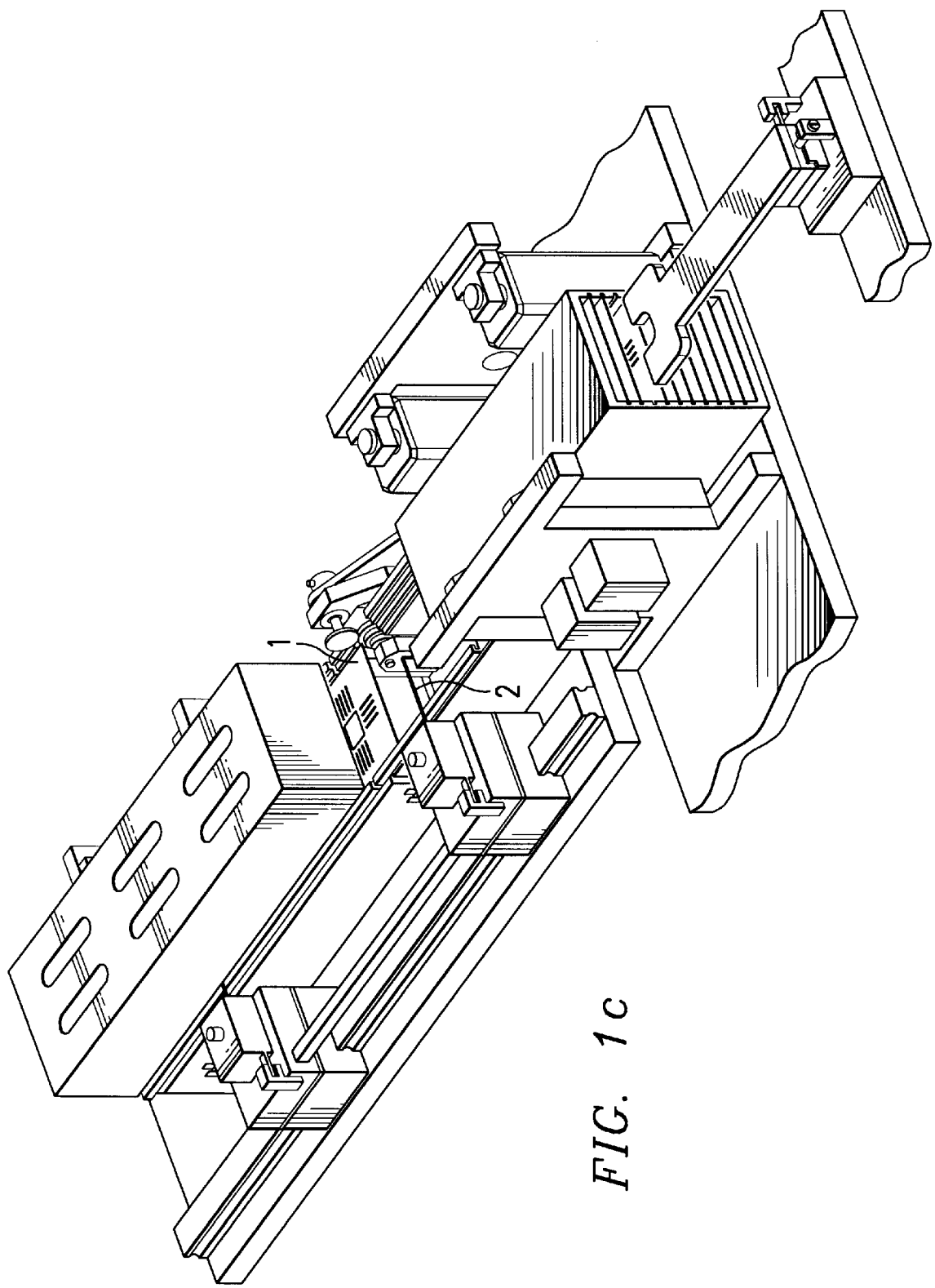

Initially, the front flag of the in-chamber transport and the pinch roller drive disc are in the "up" position. For purposes of demonstration, there is shown a cycle starting at the third leadframe strip in the preferred embodiment. The elevator platform is positioned so that the third leadframe strip from the top is aligned with the center leadframe strip track. The gooser 1 is driven forward and the gooser blade 23 engages the leadframe strip 13, pushing the leadframe strip into the leadframe strip rails 52 of the pinch roller assembly. The leadframe strip 13 is pushed sufficiently far so that it is beneath the pinch roller drive disc 49 as shown in FIG. 1b. The gooser assembly is then retracted and the gooser blade 23 is withdrawn from the carrier 11. The pinch roller drive disc 49 is lowered, capturing the leadframe strip between itself and the freely rotating bearing therebeneath. The pinch roller rotates and drives the leadframe strip into the chamber until the leadframe strip falls off the pinch roller freely rotating bearing 51. The front flag 69 of the in-chamber-transport rotates to the "down" position as shown in FIG. 1c.

Figure 1D:
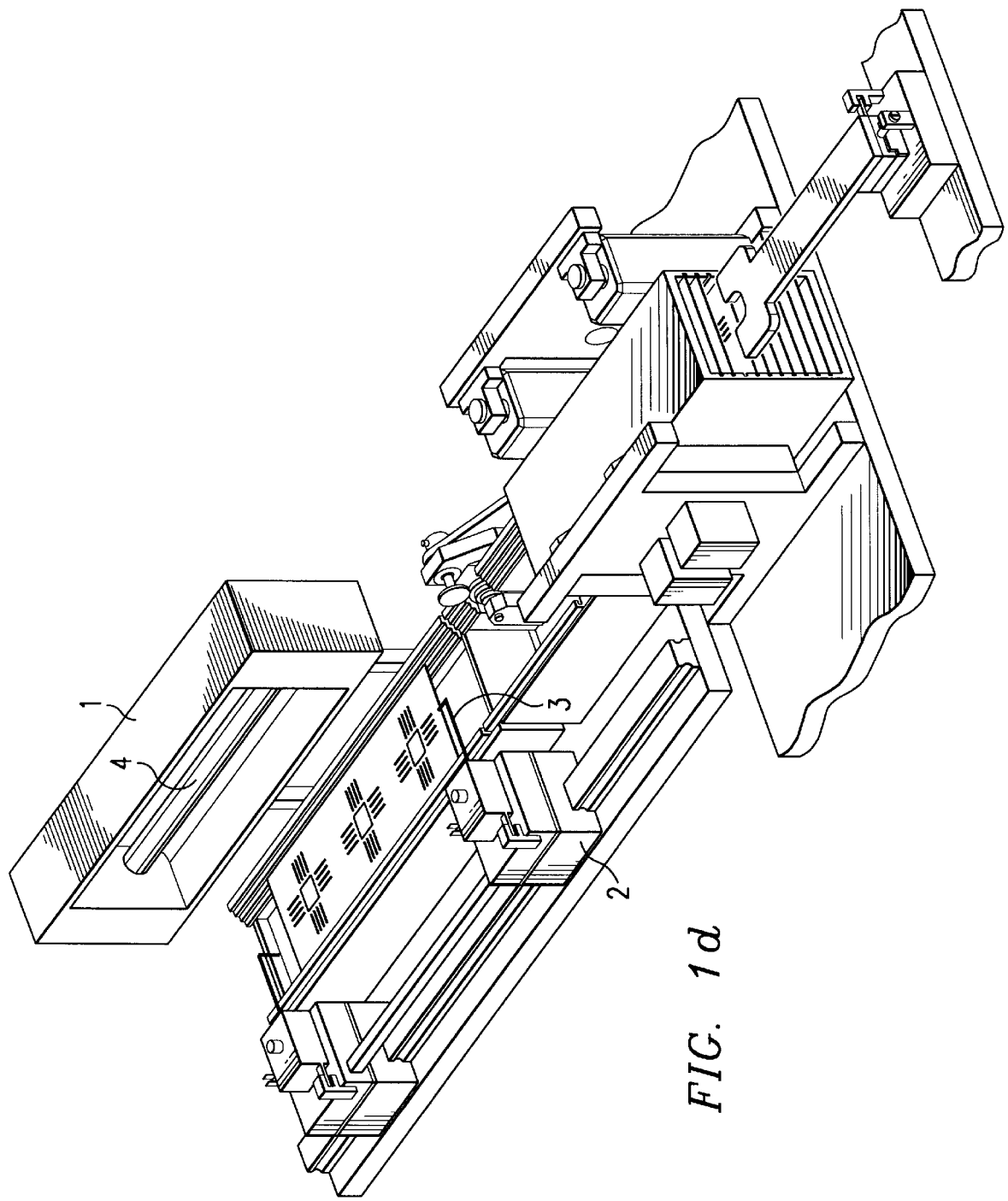

With reference to FIG. 1d, the chamber is shown in the open state for clarity, it being understood that the chamber remains closed throughout the operation. The pinch roller drive disc 49 is raised. In-chamber-transport travels away from the pinch roller assembly. The front flag 69, which is now down, engages the end of Ad the leadframe strip 13 and pushes it into the curing chamber 9 and pushes the leadframe strip to the center of the chamber. The chamber transport now travels toward the pinch roller assembly until the pair of flags, front 69 and rear 71 are centered in the chamber 9. This action removes the two flags from the active area of the chamber. The front flag is rotated "up" out of the path of the leadframe strip 13 and the lamps 101 are turned "on" in accordance with the programmed cure profile and the cure process takes place.

Figure 1E:
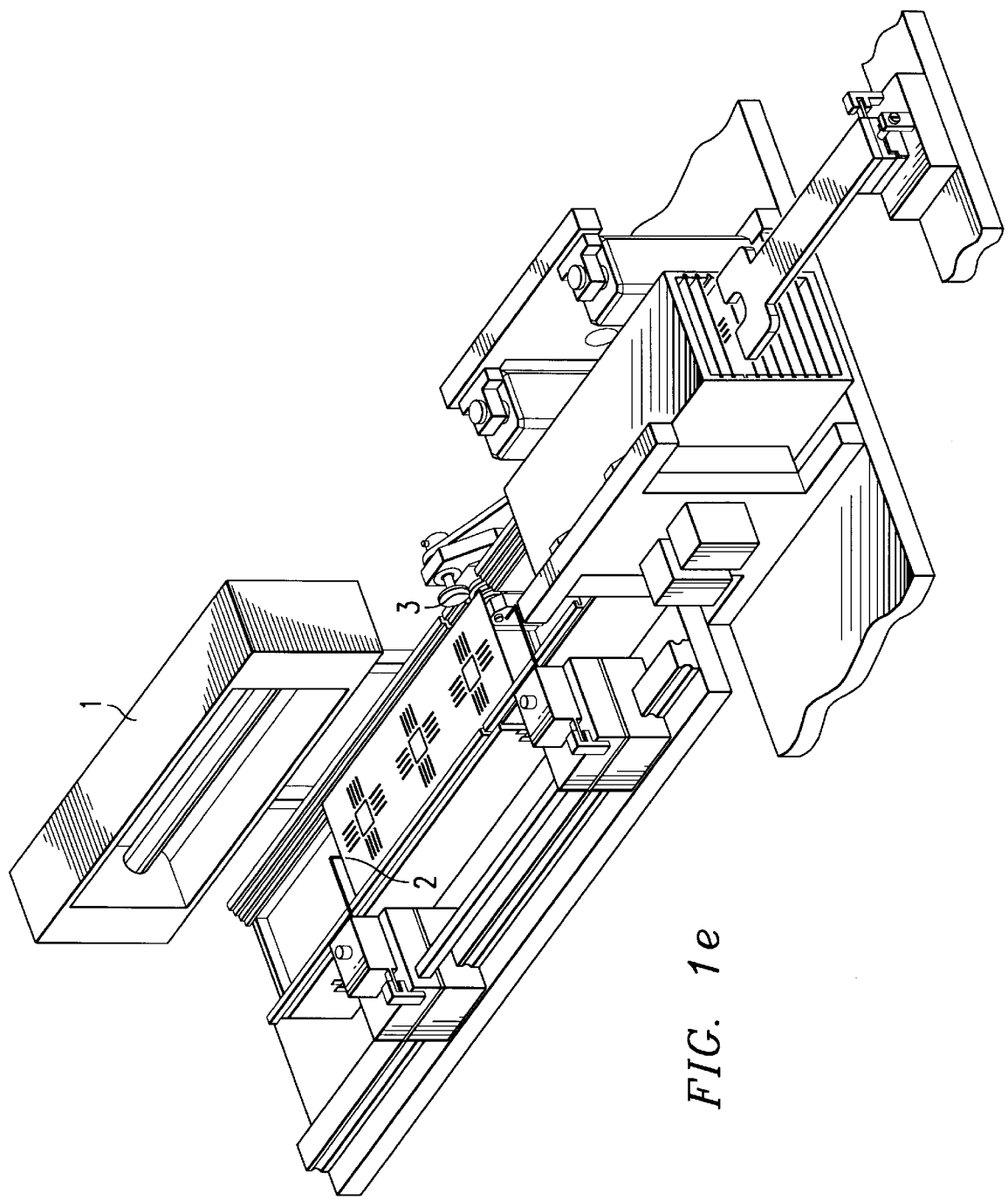
Figure 1F:
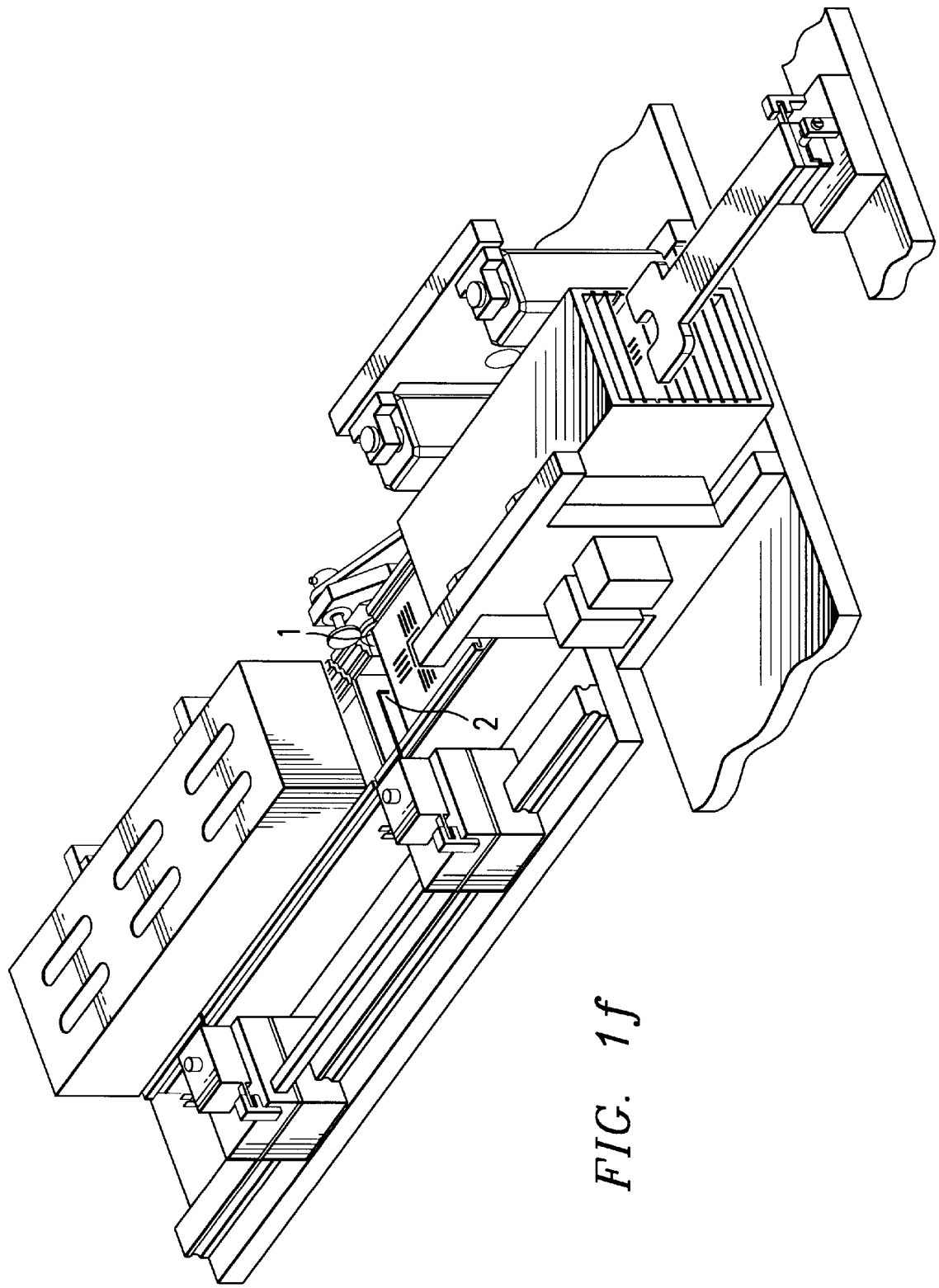
Figure 1G:
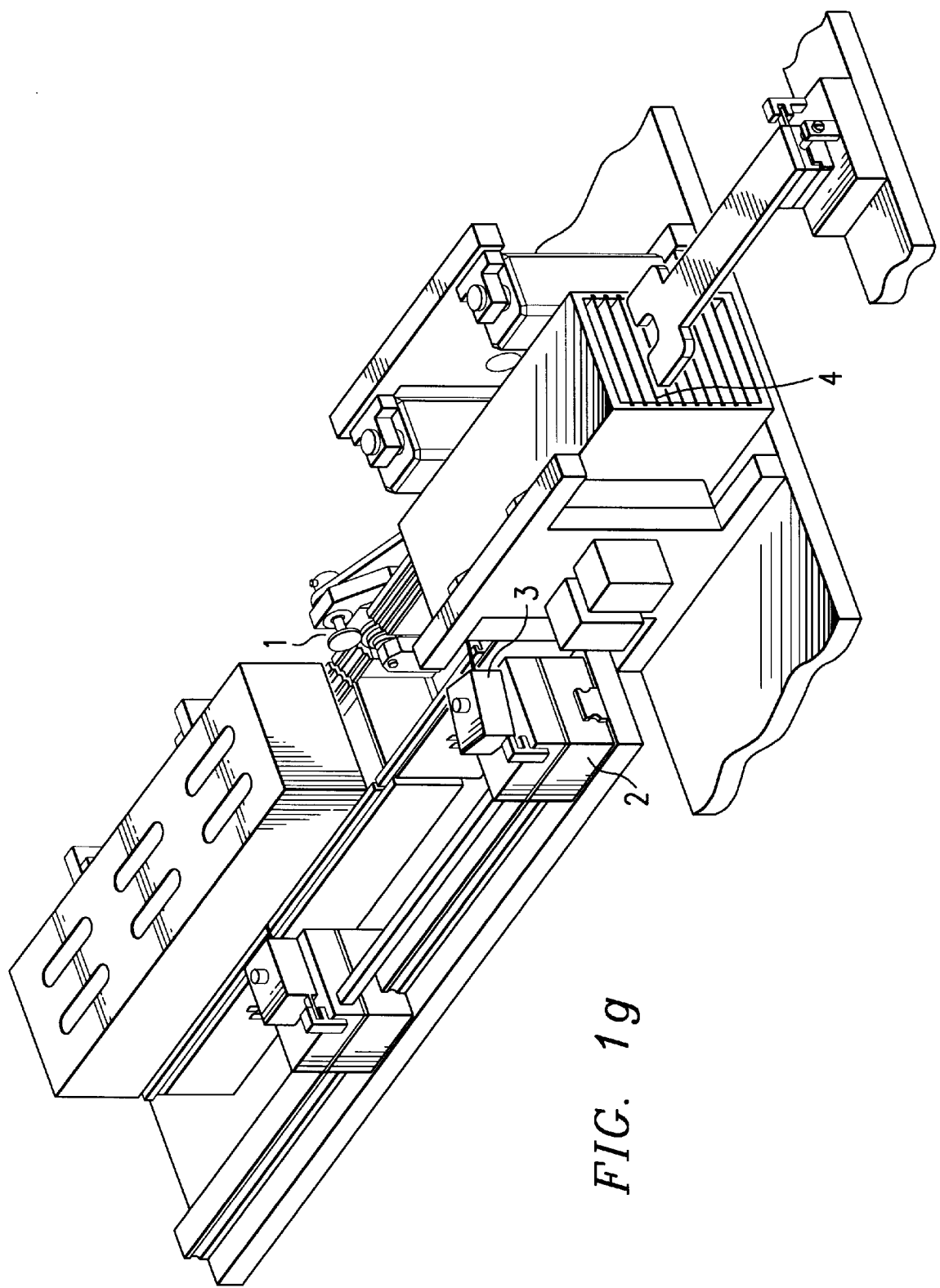

The in-chamber-transport now travels toward the pinch roller assembly with the rear flag 71 engaging the far end of the leadframe strip 13 and pushing it out of the curing chamber 9, the leadframe strip being pushed until its leading portion is beneath the pinch roller drive disc 49 as shown in FIG. 1e. The pinch roller drive disc 49 is now moved down to capture the leadframe strip between itself and the freely rotating bearing 51 therebeneath. The drive disc 49 rotates and translates the leadframe strip toward and into the carrier 11 until the leadframe strip falls off the freely rotating bearing 51. In-chamber-transport travels away from the carrier and stops just beyond the end of the leadframe strip, whereupon the front flag 69 is rotated to the "down" position as shown in FIG. 1f. The pinch roller drive disc 49 is raised and the in-chamber-transport moves toward the carrier. The front flag 69, which is "down", engages the end of the leadframe strip 13 and pushes it into the carrier 11. The in-chamber-transport then travels a slight distance farther at which time a stop (not shown) hits the front flag rotating mount 81, causing the front flag 69 to pivot and nudge the leadframe strip past the face plane of the carrier. The leadframe strip now occupies its original position in the leadframe strip magazine as shown in FIG. 1g. The in-chamber-transport now travels away from the carrier to await the next leadframe strip. The front flag 69 is rotated to the "up" position and the elevator platform is lowered by one carrier slot pitch so that a leadframe strip in the next slot is in position to repeat the above described cycle. This procedure repeats until all of the leadframe strips in the carrier have been cured.

The operation of the stand alone radiant die attach material curing apparatus described above is controlled by software which forms no part of this invention and is therefore not described herein. The functions provided by the software are set forth hereinbelow. Timing is carried out by the software with input from various sensors. The operation, in brief form, is as follows:

Gooser operation is controlled by a rodless cylinder with sensors at each extreme of travel. The software can tell when the forward goose stroke is complete and when the return goose stroke operation is complete. The gooser "jam" flags are wired into a digital I/O port which is read by the computer software. The gooser rodless cylinder actuates when a digital signal is directed to the air solenoid which controls the flow of air to the gooser rodless cylinder.

Front flag operation is controlled by the software as well. There is a miniature air cylinder which fires or returns which controls the state of the flag. When the air cylinder is fired, the flag is down. When the air cylinder is not fired (retracted), the flag is up (out of the path of the leadframe strip). There is a photosensor to verify each of these states "flag up" and "flag down". The sensors are wired through the digital I/O to the computer software as is the air solenoid which controls the flow of air to the miniature air cylinder.

The elevator motors are controlled via software. The software knows the pitch of the leadscrews which translate the rotational motion of the stepper motors to linear motion as well as the microstepping distance for each substep of the motor. In this way, the vertical position and motion of the elevator is controlled. Up/down and home sensors are provided for the elevator motion boundaries and homing operations. All sensors are connected to the digital I/O, thus to the computer software.

Pinch roller operation is controlled by the software also. The length of the leadframe strip is known, the diameter of the drive wheel and pulleys are known as is the step distance of the stepper motor driving the pinch roller. With this information, the software calculates how long to leave the pinch roller motor on to fully index the leadframe strip. A sensor positioned directly under the pinch roller senses when the leadframe strip has fallen off the pinch roller to check for jams.

In chamber transport operation is controlled and monitored by the software also. The in chamber transport travel is controlled by the motion of a belt. The belt is driven by a pulley attached to the shaft of a stepper motor which is controlled by the software. The software knows the diameter of the drive pulley and the microstepping distance for each substep of the motor to which the drive pulley is attached. The software knows the relative distances between all the relevant points along the leadframe strip track, i.e., the carrier face, the pinch roller, the curing chamber entrance, the center of the curing chamber, etc. The software also knows the length of the leadframe strip so it can accurately position the leadframe strip along the leadframe strip track. The in chamber transport jam sensors are connected to the digital I/O port of the control computer so the software can monitor when or if leadframe strip jams occur in the in chamber transport motions.

Timing of the cure and the actual lamp voltage profile during the radiant cure are controlled by the software and its inherent timers.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of curing a die attach material for a semiconductor device which comprises the steps of:
   (a) providing a carrier containing therein a plurality of stacked leadframe strips, each said leadframe strip having a die attach material thereon;
   (b) ejecting one of said leadframe strips from said carrier into a chamber for heating said die attach selective to said leadframe strip;
   (c) heating said die attach material selective to said leadframe strip in said chamber to cure said die attach material while simultaneously exhausting volatile products of said cure from said chamber;
   (d) returning said leadframe strip to its original position in said carrier;
   (e) moving said carrier to place a different one of said leadframe strips in position for ejection from said carrier; and
   (f) ejecting said different one of said leadframe strips from said carrier.

2. The method of claim 1 wherein said step of heating comprises the step of applying radiations from a tungsten-halogen lamp to said leadframe strip and said die attach material.

3. The method of claim 1 wherein said step of exhausting comprises the step of passing a gas which does not materially alter the chemical and/or physical properties of the leadframe strip in the time and at the temperature involved over said die attach material to cause volatiles emanating therefrom to pass from said chamber.

4. The method of claim 2 wherein said step of exhausting comprises the step of passing a gas which does not materially alter the chemical and/or physical properties of the leadframe strip in the time and at the temperature involved over said die attach material to cause volatiles emanating therefrom to pass from said chamber.

5. The method of claim 1 further including the step of centering said leadframe strip within said chamber.

6. The method of claim 1 wherein said step of ejecting one of said leadframe strips from said carrier into a chamber for heating said die attach selective to said leadframe strip comprises the steps of providing a first rotatable flag at the entrance to said chamber which is rotatable into and out of said chamber and rotating said first flag to push said leadframe strip into said chamber, and said step of returning said leadframe strip to its original position in said carrier includes the steps of providing a second rotatable flag at a rear portion of said chamber which is rotatable within said chamber and rotating said second flag and then said first flag to return said leadframe strip to said carrier.

7. The method of claim 2 wherein said step of ejecting one of said leadframe strips from said carrier into a chamber for heating said die attach selective to said leadframe strip comprises the steps of providing a first rotatable flag at the entrance to said chamber which is rotatable into and out of said chamber and rotating said first flag to push said leadframe strip into said chamber, and said step of returning said leadframe strip to its original position in said carrier includes the steps of providing a second rotatable flag at a rear portion of said chamber which is rotatable within said chamber and rotating said second flag and then said first flag to return said leadframe strip to said carrier.

8. The method of claim 3 wherein said step of ejecting one of said leadframe strips from said carrier into a chamber for heating said die attach selective to said leadframe strip comprises the steps of providing a first rotatable flag at the entrance to said chamber which is rotatable into and out of said chamber and rotating said first flag to push said leadframe strip into said chamber, and said step of returning said leadframe strip to its original position in said carrier includes the steps of providing a second rotatable flag at a rear portion of said chamber which is rotatable within said chamber and rotating said second flag and then said first flag to return said leadframe strip to said carrier.

9. The method of claim 4 wherein said step of ejecting one of said leadframe strips from said carrier into a chamber for heating said die attach selective to said leadframe strip comprises the steps of providing a first rotatable flag at the entrance to said chamber which is rotatable into and out of said chamber and rotating said first flag to push said leadframe strip into said chamber, and said step of returning said leadframe strip to its original position in said carrier includes the steps of providing a second rotatable flag at a rear portion of said chamber which is rotatable within said chamber and rotating said second flag and then said first flag to return said leadframe strip to said carrier.

10. The method of claim 5 wherein said step of ejecting one of said leadframe strips from said carrier into a chamber for heating said die attach selective to said leadframe strip comprises the steps of providing a first rotatable flag at the entrance to said chamber which is rotatable into and out of said chamber and rotating said first flag to push said leadframe strip into said chamber, and said step of returning said leadframe strip to its original position in said carrier includes the steps of providing a second rotatable flag at a rear portion of said chamber which is rotatable within said chamber and rotating said second flag and then said first flag to return said leadframe strip to said carrier.

* * * * *